(12) United States Patent
Ohmi et al.

(10) Patent No.: US 7,115,184 B2
(45) Date of Patent: Oct. 3, 2006

(54) PLASMA PROCESSING DEVICE

(75) Inventors: Tadahiro Ohmi, 1-17-301,
Komegafukuro 2-Chome, Aoba-Ku,
Sendai-Shi, Miyagi 980-0813 (JP);
Masaki Hirayama, Sendai (JP);
Shigetoshi Sugawa, Sendai (JP);
Tetsuya Goto, Sendai (JP)

(73) Assignees: Tadahiro Ohmi, (JP); Tokyo Electron Limited, (JP)

( * ) Notice: Subject to any disclaimer, the term of this patent is extended or adjusted under 35 U.S.C. 154(b) by 241 days.

(21) Appl. No.: 10/276,673

(22) PCT Filed: Mar. 28, 2002

(86) PCT No.: PCT/JP02/03108

§ 371 (c)(1),
(2), (4) Date: Nov. 18, 2002

(87) PCT Pub. No.: WO02/080249

PCT Pub. Date: Oct. 10, 2002

(65) Prior Publication Data

US 2003/0178144 A1    Sep. 25, 2003

(30) Foreign Application Priority Data

Mar. 28, 2001  (JP)  ............... 2001-094272

(51) Int. Cl.
*H01L 21/00* (2006.01)
*C23C 16/00* (2006.01)

(52) U.S. Cl. ............... 156/345.33; 118/723 MW; 156/345.36; 156/345.41; 156/345.34

(58) Field of Classification Search ........... 156/345.41, 156/345.33, 345.34; 118/723 MW, 715, 118/723 ME, 723 MR, 723 MA
See application file for complete search history.

(56) References Cited

U.S. PATENT DOCUMENTS

| 4,590,042 | A | * | 5/1986 | Drage ............... 422/186.06 |
| 5,010,842 | A | * | 4/1991 | Oda et al. ............ 118/723 ME |
| 5,105,761 | A | * | 4/1992 | Charlet et al. ....... 118/723 ME |
| 5,595,602 | A | * | 1/1997 | Harlan .................. 118/715 |

(Continued)

FOREIGN PATENT DOCUMENTS

EP    1115147    7/2001

(Continued)

OTHER PUBLICATIONS

Office Action issued in corresponding Korean Application (w/english translation).

(Continued)

*Primary Examiner*—Parviz Hassanzadeh
*Assistant Examiner*—Rakesh Dhingra
(74) *Attorney, Agent, or Firm*—Finnegan, Henderson, Farabow, Garrett & Dunner, LLP

(57) ABSTRACT

A plasma processing apparatus includes a processing vessel, a means for holding a substrate to be processed, an evacuation system coupled to the processing vessel, a means for supplying plasma gas to an interior of the processing vessel, a microwave antenna provided on the processing vessel, and a process gas supply part comprised of two components. The first component includes a plurality of first apertures for passing through plasma formed in interior of the processing vessel, a process gas passage, and a plurality of second apertures in communication with the process gas passage. The second component includes a plurality of third apertures axially aligned with the first apertures in the first component and diffusion surfaces upon recessed areas of the second component, located opposite to the second apertures in the first component.

13 Claims, 17 Drawing Sheets

U.S. PATENT DOCUMENTS

| | | | |
|---|---|---|---|
| 5,643,394 A * | 7/1997 | Maydan et al. | 156/345.33 |
| 5,656,334 A | 8/1997 | Doi | |
| 5,746,875 A * | 5/1998 | Maydan et al. | 156/345.34 |
| 5,861,601 A | 1/1999 | Sato et al. | |
| 6,162,323 A * | 12/2000 | Koshimizu | 156/345.26 |
| 6,245,192 B1 * | 6/2001 | Dhindsa et al. | 156/345.34 |
| 6,286,454 B1 | 9/2001 | Hirayama et al. | |
| 6,436,487 B1 | 8/2002 | Ikemoto et al. | |
| 6,663,715 B1 * | 12/2003 | Yuda et al. | 118/723 ER |
| 6,772,827 B1 * | 8/2004 | Keller et al. | 165/53 |
| 2001/0052322 A1 | 12/2001 | Hirayama et al. | |
| 2002/0002948 A1 * | 1/2002 | Hongo et al. | 118/723 R |
| 2003/0106643 A1 * | 6/2003 | Tabuchi et al. | 156/345.35 |

FOREIGN PATENT DOCUMENTS

| | | |
|---|---|---|
| JP | 9-63793 | 3/1997 |
| JP | 10251855 | 9/1998 |
| JP | 10340891 | 12/1998 |
| JP | 11-111708 | 4/1999 |
| JP | 11-168094 | 6/1999 |
| JP | 2000-58294 | 2/2000 |
| JP | 2000-195800 | 7/2000 |
| JP | 2000195800 A * | 7/2000 |
| JP | 2001020074 | 1/2001 |
| JP | 2001-49442 | 2/2001 |
| JP | 2002-64104 | 2/2002 |
| KR | 93-283028 | 5/1995 |
| KR | 1995-0015620 | 6/1995 |
| KR | 0077485 | 12/2000 |
| WO | WO-0074127 | 12/2000 |

OTHER PUBLICATIONS

Office Action issued in corresponding Korean Application (w/English translation).

Supplementary European Search Report dated Oct. 20, 2005 for Application No. EP 02 70 7229.

* cited by examiner

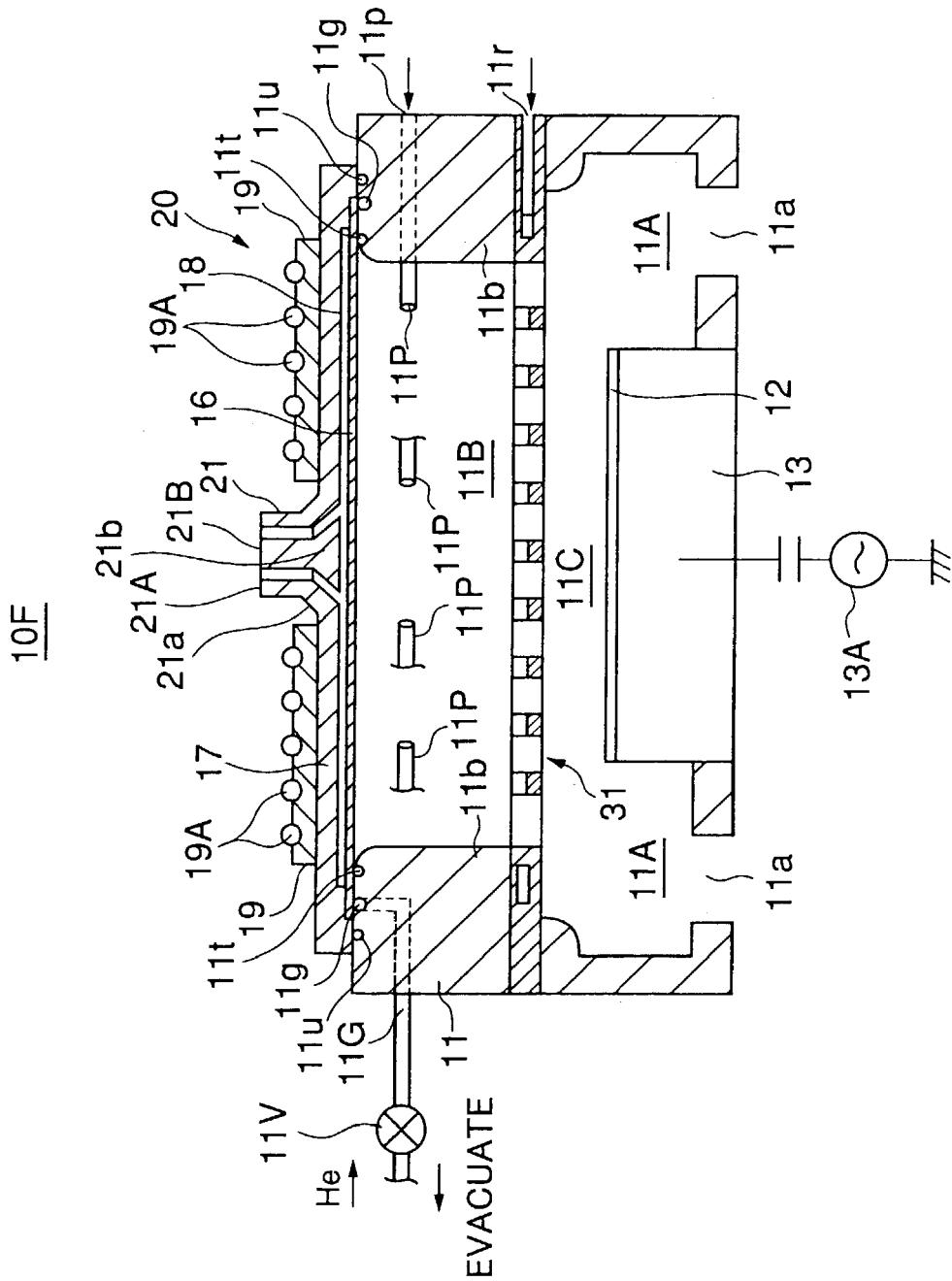

PLASMA PROCESSING DEVICE

TECHNICAL FIELD

The present invention generally related to plasma processing apparatus and more particularly to a microwave plasma processing apparatus.

Plasma process and plasma processing apparatus are indispensable technology for fabricating ultrafine semiconductor devices of these days called deep submicron devices or deep subquarter micron devices characterized by a gate length of near 0.1 µm or less, or for fabricating ultra high-resolution flat-panel display devices including liquid crystal display devices.

Conventionally, various plasma excitation methods have been used in plasma processing apparatuses used for fabrication of semiconductor devices or liquid crystal display devices. Particularly, a parallel-plate type high-frequency excitation plasma processing apparatus or an induction-coupled plasma processing apparatus are used commonly. However, such conventional plasma processing apparatuses have a drawback of non-uniform plasma formation in that the region of high electron density is limited, and it has been difficult to conduct a uniform process over the entire substrate surface with large processing rate, and hence with large throughput. This problem becomes particularly acute when processing a large diameter substrate. Further, such a conventional plasma processing device has several inherent problems, associated with its high electron temperature, in that the semiconductor devices formed on the substrate undergo damaging and that significant metal contamination is caused as a result of sputtering of a chamber wall. Thus, there are increasing difficulties in such conventional plasma processing apparatuses to meet for the stringent demand of further device miniaturization and further improvement of productivity of semiconductor devices or liquid crystal display devices.

Meanwhile, there are proposals of a microwave plasma processing apparatus that uses high-density plasma excited by a microwave electric field, in place of a direct-current magnetic field. For example, there is a proposal of a plasma processing apparatus that causes excitation of plasma by radiating a microwave into a processing vessel from a planar antenna (radial line slot antenna) having a number of slots disposed so as to form a uniform microwave, such that the microwave electric field causes ionization of a gas in a vacuum vessel. (See for example Japanese Laid-Open Patent Application 9-63793). In the microwave plasma thus excited, it is possible to realize a high plasma density over a wide area right underneath the antenna, and it becomes possible to conduct uniform plasma processing in a short duration. The microwave plasma thus formed is characterized by low electron temperature, and damaging or metal contamination of the substrate is avoided. Further, it is possible to form uniform plasma over a large surface area, and it can be easily applied to the fabrication process of a semiconductor device using a large diameter semiconductor substrate or large size liquid crystal display device.

BACKGROUND ART

FIGS. 1A and 1B show the construction of a conventional microwave plasma processing apparatus 100 having such a radial line slot antenna, wherein FIG. 1A shows the microwave plasmas processing apparatus in a cross-sectional view while FIG. 1B shows the construction of the radial line slot antenna.

Referring to FIG. 1A, the microwave plasma processing apparatus 100 has a processing chamber 101 evacuated from plural evacuation ports 116, and there is formed a stage 115 for holding a substrate 114 to be processed. In order to realize uniform processing in the processing chamber 101, a ring-shaped space 101A is formed around the stage 115, and the plural evacuation ports 116 are formed in communication with the foregoing space 101A with a uniform interval, and hence in axial symmetry with regard to the substrate. Thereby, it becomes possible to evacuate the processing chamber 101 uniformly through the space 101A and the evacuation ports 116.

On the processing chamber 101, there is formed a plate 103 of plate-like form at the location corresponding to the substrate 114 on the stage 115 as a part of the outer wall of the processing chamber 101 via a seal ring 109, wherein the shower plate 103 is formed of a dielectric material of small loss and includes a large number of apertures 107. Further, a cover plate 102 also of a dielectric material of small loss is provided on the outer side of the shower plate 103 via another seal ring 108.

The shower plate 103 is formed with a passage 104 of a plasma gas on the top surface thereof, and each of the plural apertures 107 are formed in communication with the foregoing plasma gas passage 104. Further, there is formed a plasma gas supply passage 106 in the interior of the shower plate 103 in communication with a plasma gas supply port 105 provided on the outer wall of the processing vessel 101. Thus, the plasma gas of Ar, Kr or the like supplied to the foregoing plasma gas supply port 105 is supplied to the foregoing apertures 107 from the supply passage 106 via the passage 104 and is released into a space 101B right underneath the shower plate 103 in the processing vessel 101 from the apertures 107 with substantially uniform concentration.

On the processing vessel 101, there is provided a radial line slot antenna 110 having a radiation surface shown in FIG. 1B on the outer side of the cover plate 102 with a separation of 4–5 mm from the cover plate 102. The radial line slot antenna 110 is connected to an external microwave source (not shown) via a coaxial waveguide 110A and causes excitation of the plasma gas released into the space 101B by the microwave from the microwave source. It should be noted that the gap between the cover plate 102 and the radiation surface of the radial line slot antenna 110 is filled with the air.

The radial line slot antenna 110 is formed of a flat disk-like antenna body 110B connected to an outer waveguide of the coaxial waveguide 110A and a radiation plate 110C is provided on the mouth of the antenna body 110B, wherein the radiation plate 110C is formed with a number of slots 110a and slots 110b wherein slots 110b are formed in a direction crossing the slots 110a perpendicularly as represented in FIG. 1B. Further, a retardation plate 110D of a dielectric film of uniform thickness is inserted between the antenna body 110B and the radiation plate 110C.

In the radial line slot antenna 110 of such a construction, the microwave supplied from the coaxial waveguide 110 spreads between the disk-like antenna body 110B and the radiation plate 110C as it is propagated in the radial direction, wherein there occurs a compression of wavelength as a result of the action of the retardation plate 110D. Thus, by forming the slots 110a and 110b in concentric relationship in correspondence to the wavelength of the radially propagating microwave so as to cross perpendicularly with each other, it becomes possible to emit a plane wave having a circular polarization state in a direction substantially perpendicular to the radiation plate 110C.

By using such a radial line slot antenna 110, uniform plasma is formed in the space 101B right underneath the shower plate 103. The high-density plasma thus formed is characterized by a low electron temperature and thus, there is caused no damaging of the substrate 114 and there is caused no metal contamination as a result of the sputtering of the vessel wall of the processing vessel 101.

In the plasma processing apparatus of FIG. 1, it should further be noted that there is provided a conductive structure 111 in the processing vessel 101 between the shower plate 103 and the substrate 114, wherein the conductive structure is formed with a number of nozzles 113 supplied with a processing gas from an external processing gas source (not shown) via a processing gas passage 112 formed in the processing vessel 101, and each of the nozzles 113 releases the processing gas supplied thereto into a space 101C between the conductive structure 111 and the substrate 114. It should be noted that the conductive structure 111 is formed with openings between adjacent nozzles 113 with a size such that the plasma formed in the space 101B passes efficiently from the space 101B to the space 101C by way of diffusion.

Thus, in the case a processing gas is released into the space 101C from the conductive structure 111 via the nozzles 113, the processing gas is excited by the high-density plasma formed in the space 101B and a uniform plasma processing is conducted on the substrate 114 efficiently and with high rate, without damaging the substrate or the devices on the substrate, and without contaminating the substrate. Further, it should be noted that the microwave emitted from the radial line slot antenna is blocked by the conductive structure and there is no possibility of such a microwave causes damaging in the substrate 114.

Meanwhile, in the plasma processing apparatus 100 mentioned in FIGS. 1A and 1B, it is important to supply a process gas uniformly from the process gas supply part 111. Also, it is necessary that the process gas supply part 111 enable plasma excited in the space 101B to pass to the space 101C right above the substrate 114 without delay.

FIG. 2 is a bottom view showing a construction of the conventional process gas supply part 111.

Referring to FIG. 2, the process gas supply part 111 is a disk-like plate formed of a stainless steel added with Al or the like. In the process gas supply part 111, there are formed a number of large apertures 111B disposed in a matrix form to pass high-density plasma in the space 101B. Also, there is formed a process gas distribute passage 112A in communication with the process gas passage 112 along the outer circumference of the disk-like plate 111. There is formed a lattice-shaped gas passage 113A in communication with the process gas distribute passage 112A. In the lattice-shaped gas passage 113A, there are a number of nozzle apertures 113.

According to the construction, a process gas is released almost uniformly from a number of the nozzle apertures 113 to a surface of the substrate 114 to be processed represented in FIG. 2 by a broken line. On the other hand, the nozzle apertures 113 are formed toward the substrate 114 in the bottom view of FIG. 2. As a result, even if the nozzle apertures 113 are formed densely, it is difficult to diffuse the process gas enough to reach the surface of the substrate 114. On the other hand, if the nozzle apertures 113 are provided too densely, the process gas is mainly released on the fringe of the substrate 114. Accordingly, it is likely that the process gas is scarce around the center of the substrate 114. In addition, in the plasma processing apparatus 100, a distance between the shower plate 103 and the substrate 114 is shortened in order to evacuate the spaces 101B and 101C immediately. Therefore, the process gas released from the nozzle apertures 113 cannot diffuse sufficiently because the process gas reaches the substrate 113 immediately.

Furthermore, the plasma processing apparatus 100 in FIGS. 1A and 1B has the problem that the temperature thereof rises because the process gas supply part 111 is exposed to a large amount of thermal flux caused by high-density plasma.

DISCLOSURE OF INVENTION

Accordingly, it is an object of the present invention to provide a novel and useful plasma processing apparatus in which the foregoing problems are eliminated.

Another and more specific object of the present invention is to provide a plasma processing apparatus comprising a process gas supply part capable of supplying a process gas uniformly.

Another object of the present invention is to provide a plasma processing apparatus capable of avoiding a rise in temperature thereof.

Another object of the present invention is to provide a plasma processing apparatus, comprising: a processing vessel defined by an outer wall and having a stage for holding a substrate to be processed on the stage; an evacuation system coupled to the processing vessel; a plasma gas supply part for supplying plasma gas to an interior of the processing vessel; a microwave antenna provided on the processing vessel in correspondence to the substrate to be processed on the stage; and a process gas supply part provided between the substrate to be processed on the stage and the plasma gas supply part so as to face the substrate to be processed, wherein the process gas supply part comprises a plurality of first apertures for passing through plasma formed in the interior of the processing vessel, a process gas passage capable of connecting to a process gas source, a plurality of second apertures in communication with the process gas passage and a diffusion part provided opposite to the second aperture for diffusing process gas released from the second aperture.

According to the present invention, in the process gas supply part, there is provided the diffusion part corresponding to a nozzle aperture releasing the process gas, thereby curving a flow of the process gas in a lateral direction and facilitating diffusion and mixture of the process gas. At the time, if the process gas supply part comprises a first part having the process gas passage and the nozzle aperture and a second part having the diffusion part, it becomes possible to form easily the diffusion part in a depression form corresponding to the nozzle aperture. When such a diffusion part is provided at both sides of a nozzle aperture to pass through plasma alternately, the diffusion part makes it possible to further curve the flow of the process gas that has been curved in the lateral direction, thereby further facilitating diffusion and mixture of the process gas. Also, the first part and the second part are formed of different members and there is provided a coolant passage in the second part. As a result, it is possible to suppress a rise in temperature of the process gas supply part.

Another object of the present invention is to provide a plasma processing apparatus, comprising: a processing vessel defined by an outer wall and having a stage for holding a substrate to be processed; an evacuation system coupled to the processing vessel; a plasma gas supply part for supplying plasma gas to an interior of the processing vessel; a microwave antenna provided on the processing vessel in correspondence to the substrate to be processed on the stage; and a process gas supply part provided between the substrate to be processed on the stage and the plasma gas supply part so as to face the substrate to be processed on the stage, wherein the process gas supply part comprises a plurality of first apertures for passing through plasma formed in the interior of the processing vessel, a process gas passage capable of connecting to a process gas source, and a plurality of second apertures in communication with the process gas passage, the second aperture releasing the process gas in a slanting direction with respect to the substrate to be processed.

According to the present invention, the process gas supplied from the process gas supply part bounces on a surface of the substrate to be processed, thereby reaching a microwave window and the process gas supply part. As a result, it becomes possible to avoid the problem that deposition arises.

Another object of the present invention is to provide a plasma processing apparatus, comprising: a processing vessel defined by an outer wall and having a stage for holding a substrate to be processed; an evacuation system coupled to the processing vessel; a plasma gas supply part for supplying plasma gas to an interior of the processing vessel; a microwave window provided on a part of the outer wall of the processing vessel so as to face the substrate to be processed on the stage, the microwave window being formed of a dielectric material; a microwave antenna coupled to the microwave window; a process gas supply part provided between the substrate to be processed on the stage and the plasma gas supply part so as to face the substrate to be processed on the stage; and a temperature control part controlling a surface temperature of the microwave window around 150° C. with respect to a side faced on the substrate to be processed.

According to the present invention, the temperature control of the microwave window around 150° C. suppresses formation of deposition on a surface of the microwave window.

Other objects, features and advantages of the present invention will become more apparent from the following detailed description when read in conjunction with the accompanying drawings.

BRIEF DESCRIPTION OF DRAWINGS

FIG. 16 is a diagram showing a structure of a plasma processing apparatus according to an eighth embodiment of the present invention.

BEST MODE FOR CARRYING OUT THE INVENTION

Hereinafter, the present invention will be described in detail with reference to embodiments.

FIRST EMBODIMENT

Figure 1A:
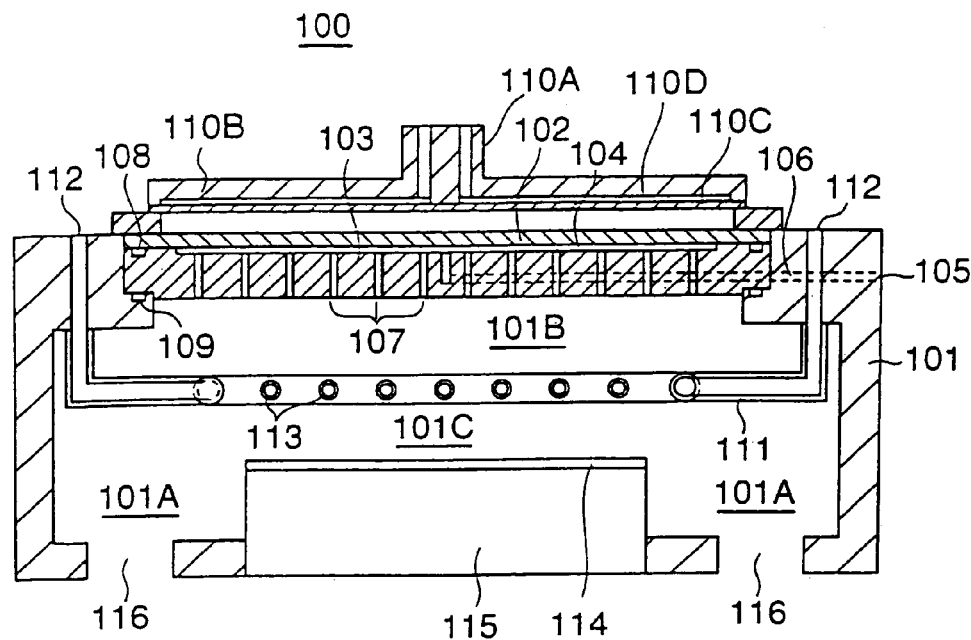
FIGS. 1A and 1B are diagrams showing a structure of a conventional microwave plasma processing apparatus that uses a radial line slot antenna.
Figure 1B:
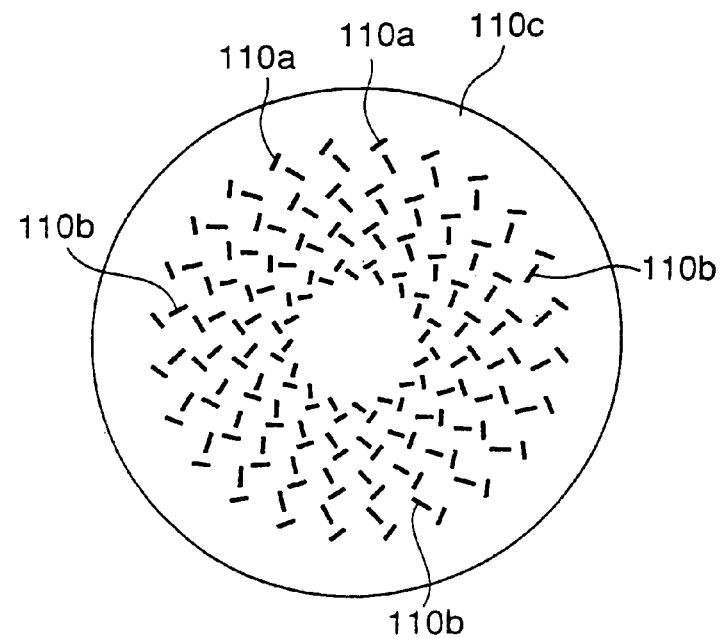
Figure 2:
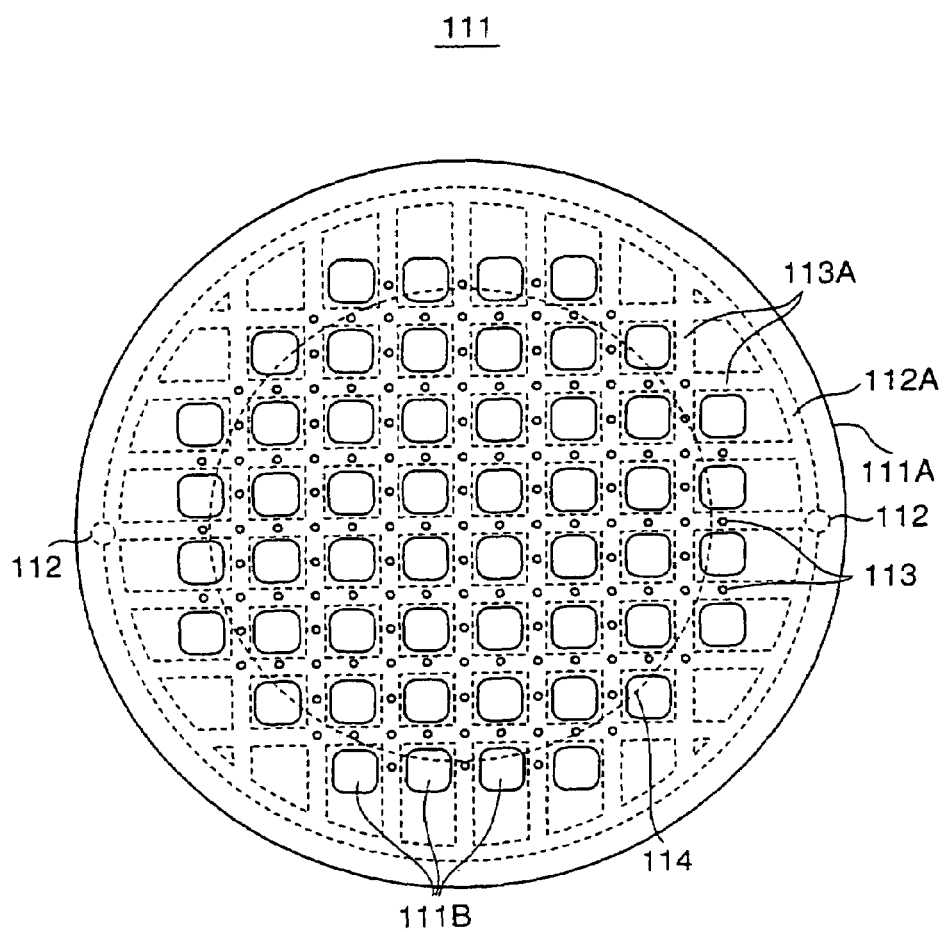
FIG. 2 is a bottom diagram showing a structure of a process gas supply mechanism of the microwave plasma processing apparatus of FIG. 1.
Figure 3A:
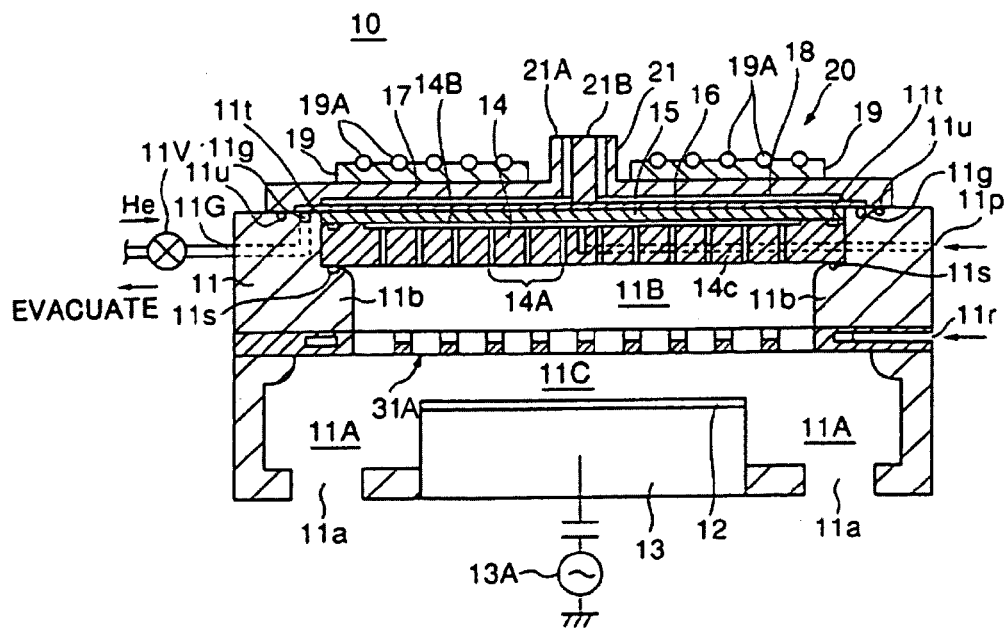
FIGS. 3A and 3B are diagrams showing a structure of a microwave plasma processing apparatus according to a first embodiment of the present invention.
Figure 3B:
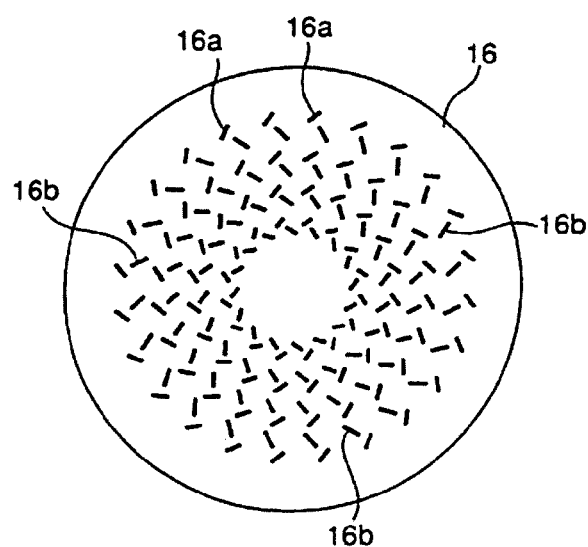

FIGS. 3A and 3B are diagrams showing a construction of a microwave plasma processing apparatus 10 according to a first embodiment of the present invention.

Referring to FIG. 3A, the microwave plasma processing apparatus 10 includes a processing vessel 11 and a stage 13 provided in the processing vessel 11 for holding a substrate 12 to be processed by an electrostatic chuck, wherein the stage 13 is preferably formed of AlN or $Al_2O_3$ by a hot isostatic pressing (HIP) process. In the processing vessel 11, there are formed at least two or preferably more than or equal to three evacuation ports 11a in a space 11A surrounding the stage 13 with an equal distance, and hence with an axial symmetry with respect to the substrate 12 on the stage 13. The processing vessel 11 is evacuated to a low pressure via the evacuation port 11a by a gradational lead screw pump to be explained later.

The processing vessel 11 is preferably formed of an austenite stainless steel containing Al, and there is formed a protective film of aluminum oxide on the inner wall surface by an oxidizing process. Further, there is formed a disk-like shower plate 14 of dense $Al_2O_3$, formed by a HIP process, in the part of the outer wall of the processing vessel 11 corresponding to the substrate 12 as a part of the outer wall, wherein the shower plate 14 includes a large number of nozzle apertures 14A. The $Al_2O_3$ shower plate 14 thus formed by a HIP process is formed by using an $Y_2O_3$ additive and has porosity of 0.03% or less. This means that the $Al_2O_3$ shower plate is substantially free from pores or pinholes and has a very large, while not so large as that of AlN, thermal conductivity for a ceramic of 30 W/m·K.

The shower plate 14 is mounted on the processing vessel 11 via a seal ring 11s, and a cover plate 15 of dense $Al_2O_3$ formed also of an HIP process is provided on the shower plate 14 via a seal ring 11t. The shower plate 14 is formed with a depression 14B communicating with each of the nozzle apertures 14A and serving for the plasma gas passage, at the side thereof contacting with the cover plate 15, wherein the depression 14B also communicates with another plasma gas passage 14C formed in the interior of the shower plate 14 in communication with a plasma gas inlet 11p formed on the outer wall of the processing vessel 11.

The shower plate 14 is held by an extending part 11b formed on the inner wall of the processing vessel 11, wherein the extending part 11b is formed with a round surface at the part holding the shower plate 14 so as to suppress electric discharge.

Thus, the plasma gas such as Ar or Kr supplied to the plasma gas inlet 11p is supplied to a space 11B right underneath the shower plate 14 uniformly via the apertures 14A after being passed through the passages 14C and 14B in the shower plate 14.

On the cover plate 15, there is provided a radial line slot antenna 20 formed of a disk-like slot plate 16 formed with a number of slots 16a and 16b shown in FIG. 3B in intimate contact with the cover plate 15, a disk-like antenna body 17 holding the slot plate 16, and a retardation plate 18 of a dielectric material of low loss such as $Al_2O_3$, $SiO_2$ or $Si_3N_4$ sandwiched between the slot plate 16 and the antenna body 17. The radial line slot antenna 20 is mounted on the processing vessel 11 by way of a seal ring 11u, and a microwave of 2.45 GHz or 8.3 GHz frequency is fed to the radial line slot antenna 20 from an external microwave source (not shown) via a coaxial waveguide 21. The microwave thus supplied is radiated into the interior of the processing vessel from the slots 16a and 16b on the slot plate 16 via the cover plate 15 and the shower plate 14. Thereby, the microwave causes excitation of plasma in the plasma gas supplied from the apertures 14A in the space 11B right underneath the shower plate 14. It should be noted that the cover plate 15 and the shower plate 14 are formed of $Al_2O_3$ and function as an efficient microwave-transmitting window. In order to avoid plasma excitation in the plasma gas passages 14A–14C, the plasma gas is held at the pressure of about 6666 Pa–13332 Pa (about 50–100 Torr) in the foregoing passages 14A–14C.

In order to improve intimate contact between the radial line slot antenna 20 and the cover plate 15, the microwave plasma processing apparatus 10 of the present embodiment has a ring-shaped groove 11g on a part of the processing vessel 11 so as to engage with the slot plate 16. By evacuating the groove 11g via an evacuation port 11G communicating therewith, the pressure in the gap formed between the slot plate 16 and the cover plate 15 is reduced and the radial line slot antenna 20 is urged firmly upon the cover plate 15 by the atmospheric pressure. It should be noted that such a gap includes not only the slots 16a and 16b formed in the slot plate 16 but also a gap formed by other various reasons. It should be noted further that such a gap is sealed by the seal ring 11u provided between the radial line slot antenna 20 and the processing vessel 11.

By filling the gap between the slot plate 16 and the cover plate 15 with an inert gas of small molecular weight via the evacuation port 11G and the groove 11g, heat transfer from the cover plate 15 to the slot plate 16 is facilitated. Thereby, it is preferable to use He for such an inert gas in view of large thermal conductivity and large ionization energy. In the case the gap is filled with He, it is preferable to set the pressure to about 0.8 atm. In the construction of FIG. 3, there is provided a valve 11V on the evacuation port 11G for the evacuation of the groove 11g and filling of the inert gas into groove 11g.

It should be noted that an outer waveguide tube 21A of the coaxial waveguide 21A is connected to the disk-like antenna body 17 while a central conductor 21B is connected to the slot plate 16 via an opening formed in the retardation plate 18. Thus, the microwave fed to the coaxial waveguide 21A is propagated in the radial direction between the antenna body 17 and the slot plate 16 and is emitted from the slots 16a and 16b.

FIG. 3B shows the slots 16a and 16b formed on the slot plate 16.

Referring to FIG. 3B, the slots 16a are arranged in a concentric manner such that there is provided a slot 16b for each slot 16a such that the slot 16b crosses the slot 16a perpendicularly and such that the slot 16b is aligned concentrically with the slot 16a. The slots 16a and 16b are formed with an interval corresponding to the wavelength of the microwave compressed by the radiation plate 16 in the radial direction of the slot plate 16, and as a result, the microwave is radiated from the slot plate 16 in the form of a near plane wave. Because the slots 16a and the slots 16b are formed in the mutually perpendicular relationship, the microwave thus radiated forms a circularly polarized wave including two perpendicular polarization components.

In the plasma processing apparatus 10 of FIG. 3A, there is provided a coolant block 19 formed with a coolant water passage 19A on the antenna body 17, and the heat accumulated in the shower plate 14 is absorbed via the radial line slot antenna 20 by cooling the coolant block 19 by the coolant water in the coolant passage 19A. The coolant water passage 19A is formed on the coolant block 19 in a spiral form, and coolant water having a controlled oxidation-reduction potential is supplied thereto, wherein the control of the oxidation reduction potential is achieved by eliminating oxygen dissolved in the coolant water by way of bubbling of an $H_2$ gas.

In the microwave plasma processing apparatus 10 of FIG. 3A, there is further provided a process gas supply mechanism 31 in the processing vessel 11 between the shower plate 14 and the substrate 12 on the stage 13, wherein the process gas supply mechanism 31 has gas passages 31A arranged in a lattice shape and releases a process gas supplied from a process gas inlet port 11r provided on the outer wall of the processing vessel 11 through a large number of process gas nozzle apertures. Thereby, desired uniform substrate processing is achieved in a space 11C between the process gas supply structure 31 and the substrate 12. Such substrate processing includes plasma oxidation processing, plasma nitridation processing, plasma oxynitridation processing, and plasma CVD processing. Further, it is possible to conduct a reactive ion etching of the substrate 12 by supplying a readily decomposing fluorocarbon gas such as $C_4F_8$, $C_5F_8$ or $C_4F_6$ or an etching gas containing F or Cl and further by applying a high-frequency voltage to the stage 13 from a high-frequency power source 13A.

In the microwave plasma processing apparatus 10 of the present embodiment, it is possible to avoid deposition of reaction byproducts on the inner wall of the processing vessel by heating the outer wall of the processing vessel 11 to a temperature of about 150° C. Thereby, the microwave plasma processing apparatus 10 can be operated constantly and with reliability, by merely conducing a dry cleaning process once a day or so.

Figure 4:
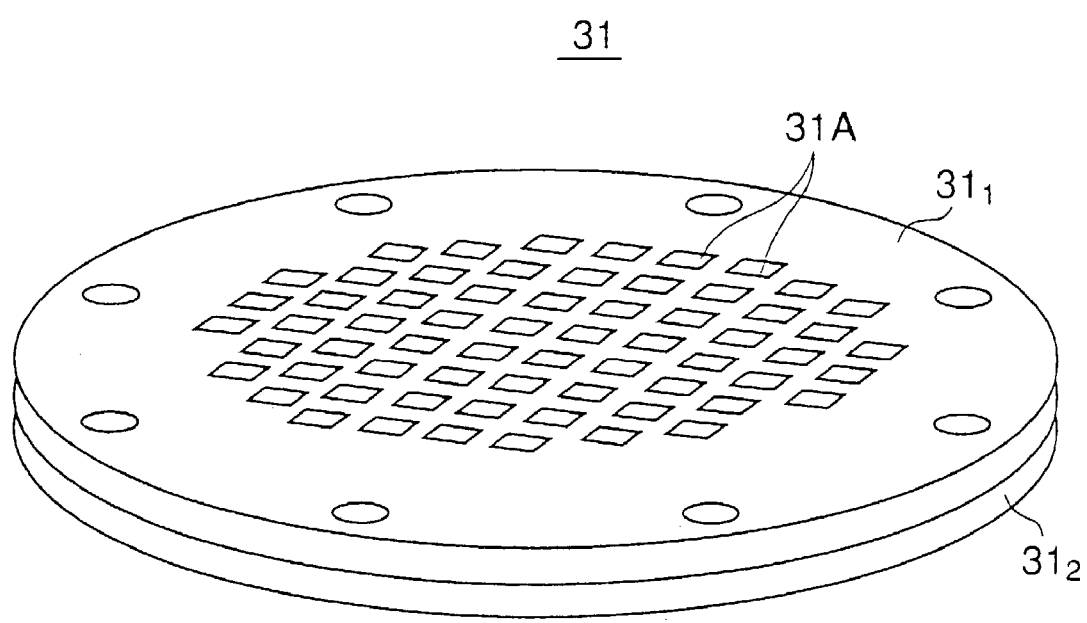
FIG. 4 is a perspective view showing a structure of a process gas supply mechanism of the microwave plasma processing apparatus of FIG. 3.

FIG. 4 is a bottom view showing a structure of the process gas supply mechanism 31 of FIG. 3A.

Referring to FIG. 4, the process gas supply mechanism 31 is formed in a stack of disk-like conductive members $31_1$ and $31_2$ such as an Al alloy containing Mg or a stainless steel added with Al. There is provided apertures 31A disposed in a matrix form to serve for a plasma gas passage. For example, the aperture 31A has a size of 19 mm×19 mm and is provided iteratively at a pitch of 24 mm both in the row direction and in the column direction. The process gas supply mechanism 31 has a total thickness of about 8.5 mm and is typically mounted with a separation of about 16 mm from the surface of the substrate 12.

Figure 5:
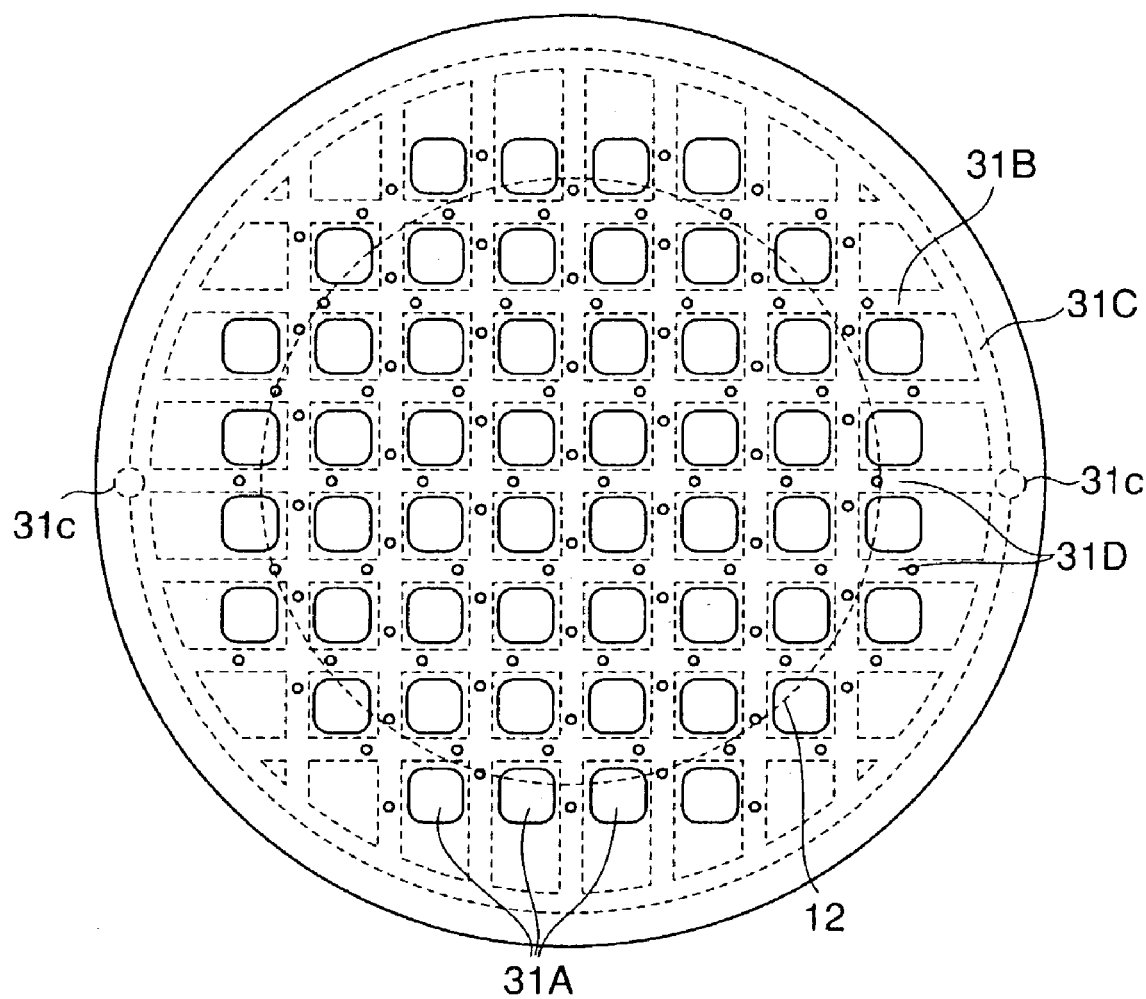
FIG. 5 is a bottom view showing a disk-like conductive body constituting a portion of the process gas supply mechanism in FIG. 4.

FIG. 5 is a bottom diagram showing a structure of the disk-like conductive member $31_1$ in FIG. 4.

Referring to FIG. 5, in the disk-like conductive member $31_1$, there is provided a lattice-shaped process gas passage 31B in communication with the process gas supply passage 31C formed along an outer circumference of the disk-like conductive member $31_1$ represented by a broken line in FIG. 5. The process gas supply passage 31C is connected to the process gas inlet port 11r. In the opposite surface of the disk-like conductive member $31_1$, there are formed a large number of process gas nozzle apertures 31D in communication with the process gas passage 31B. The process gas is released from the process gas nozzle apertures 31D to the disk-like conductive member $31_2$.

Figure 6:
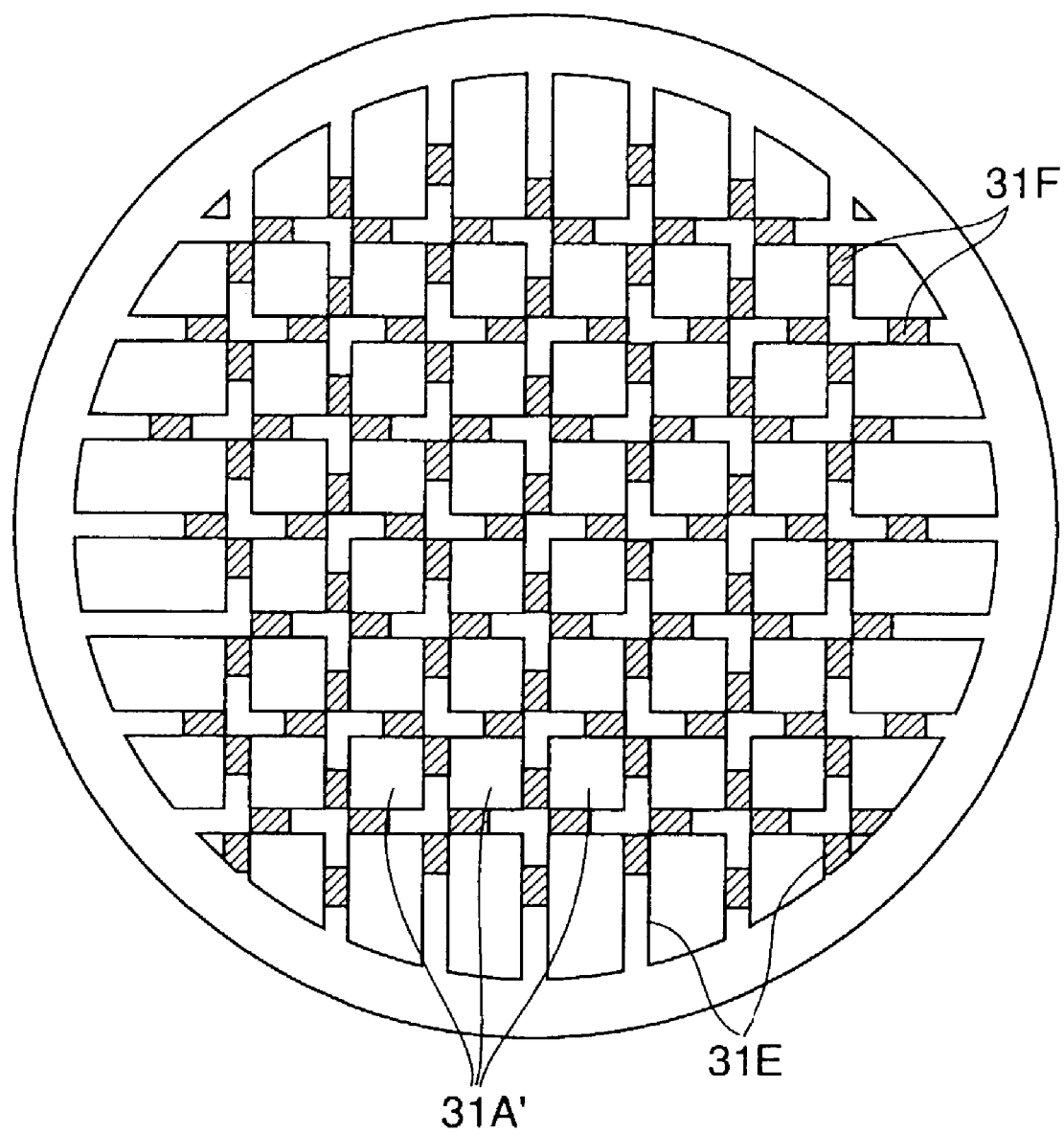
FIG. 6 is a plane view showing a disk-like conductive body constituting another portion of the process gas supply mechanism in FIG. 4.

FIG. 6 is a plane view showing a structure of the disk-like conductive member $31_2$.

Referring to FIG. 6, in the disk-like conductive member $31_2$, there are formed process gas apertures 31A' disposed in a matrix form corresponding to the plasma gas apertures 31A in the disk-like conductive member $31_1$. The process gas apertures 31A' are defined by a lattice-shaped structure 31E in the disk-like conductive member $31_2$.

Figure 7:
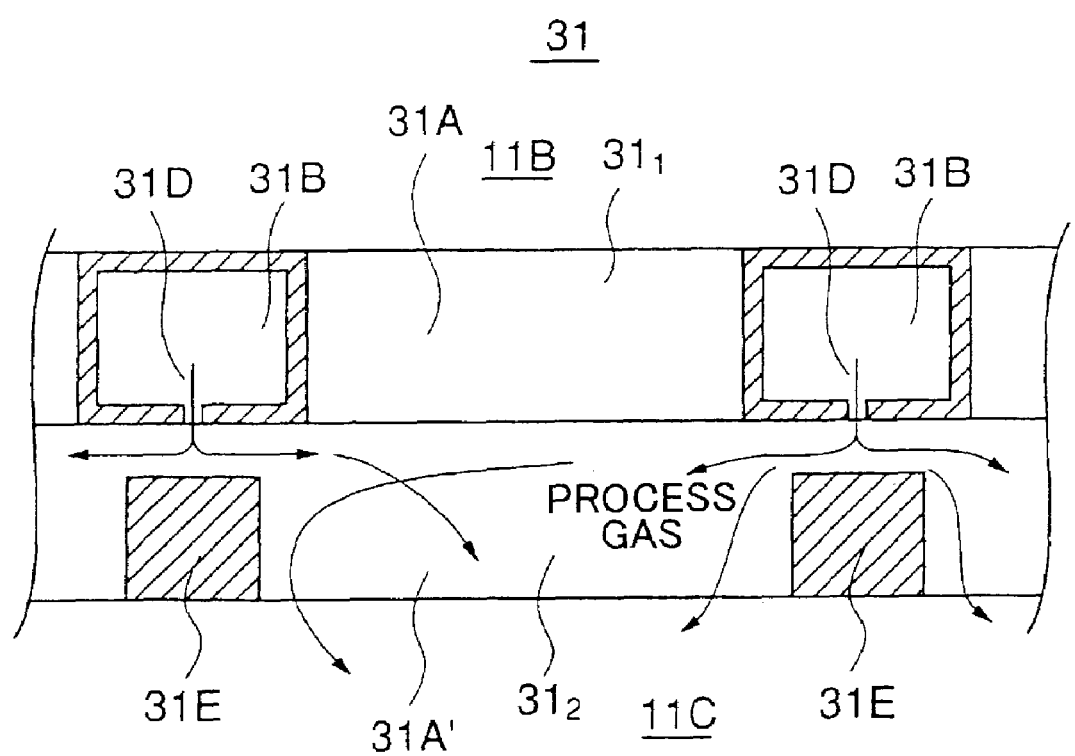
FIG. 7 is a diagram explaining functions of the process gas supply mechanism in FIG. 4.

As shown in FIG. 6, in the lattice-shaped structure 31, there are formed depressions 31F of a typical depth of about 1 mm for each of the process gas nozzle apertures 31D in the disk-like conductive member $31_1$, wherein the depression 31F prevents a process gas released from the process gas nozzle apertures 31D from going straight, whereby a flow of the process gas flows is curved as shown in FIG. 7. Thus, the depression 31F is provided as a diffusion part. Here, FIG. 7 is a sectional view of a portion of the process gas supply mechanism 31 in FIG. 4, wherein those parts explained previously are designated by the same reference numerals and the description thereof will be omitted.

Figure 8:
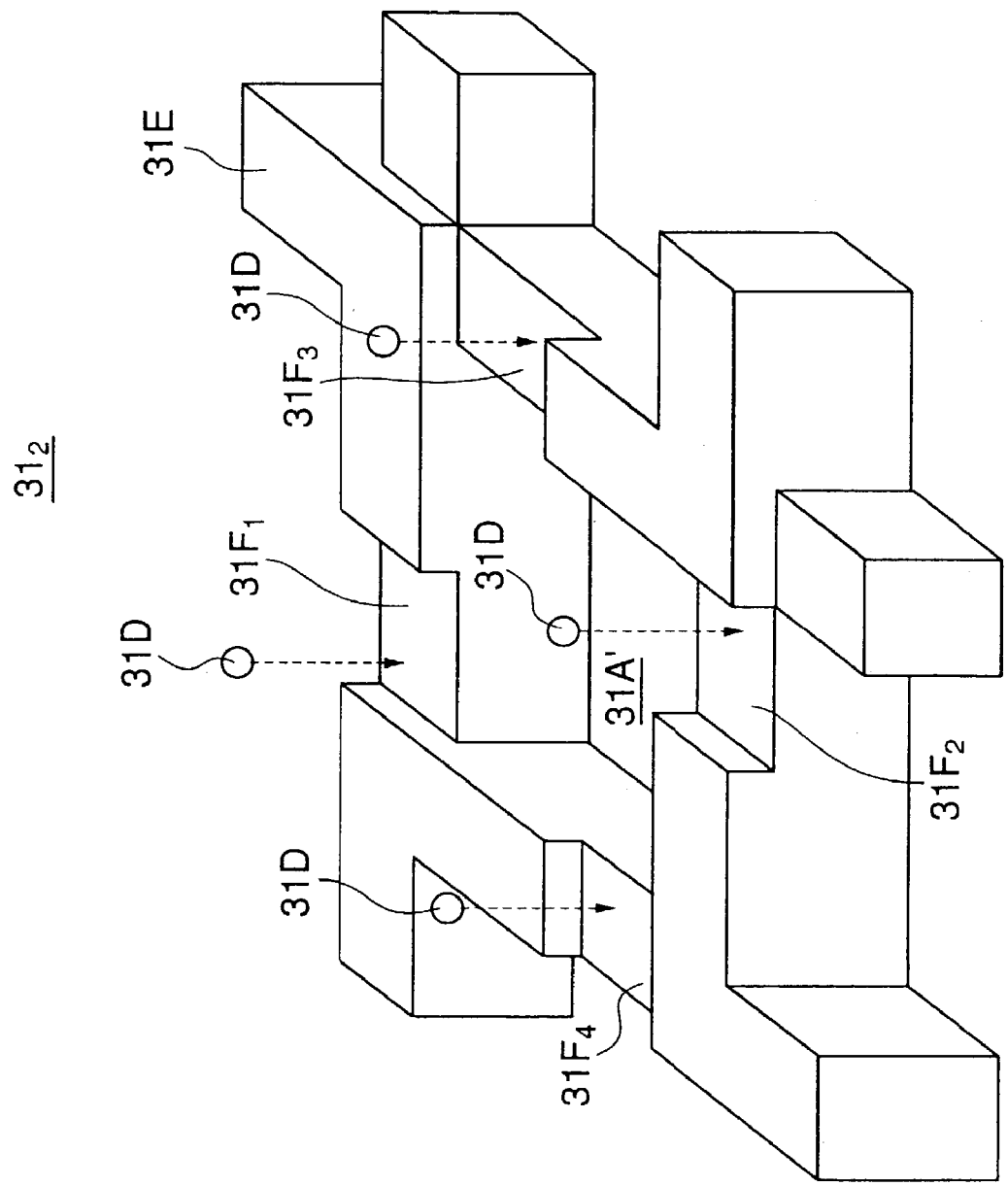
FIG. 8 is an enlarged view showing a portion of the disk-like conductive body in FIG. 5.

FIG. 8 is an enlarging view showing a portion of the disk-like conductive member $31_2$ in FIG. 6.

Referring to FIG. 8, around the process gas apertures 31A', there are formed depressions $31F_1$ through $31F_4$ as a diffusion part 31F, wherein a pair of depressions being mutually faced with respect to the process gas aperture 31A', for example, a pair of the depressions $31F_1$ and $31F_2$, or a pair of the depressions $31F_3$ and $31F_4$, is formed alternately.

Figure 9:
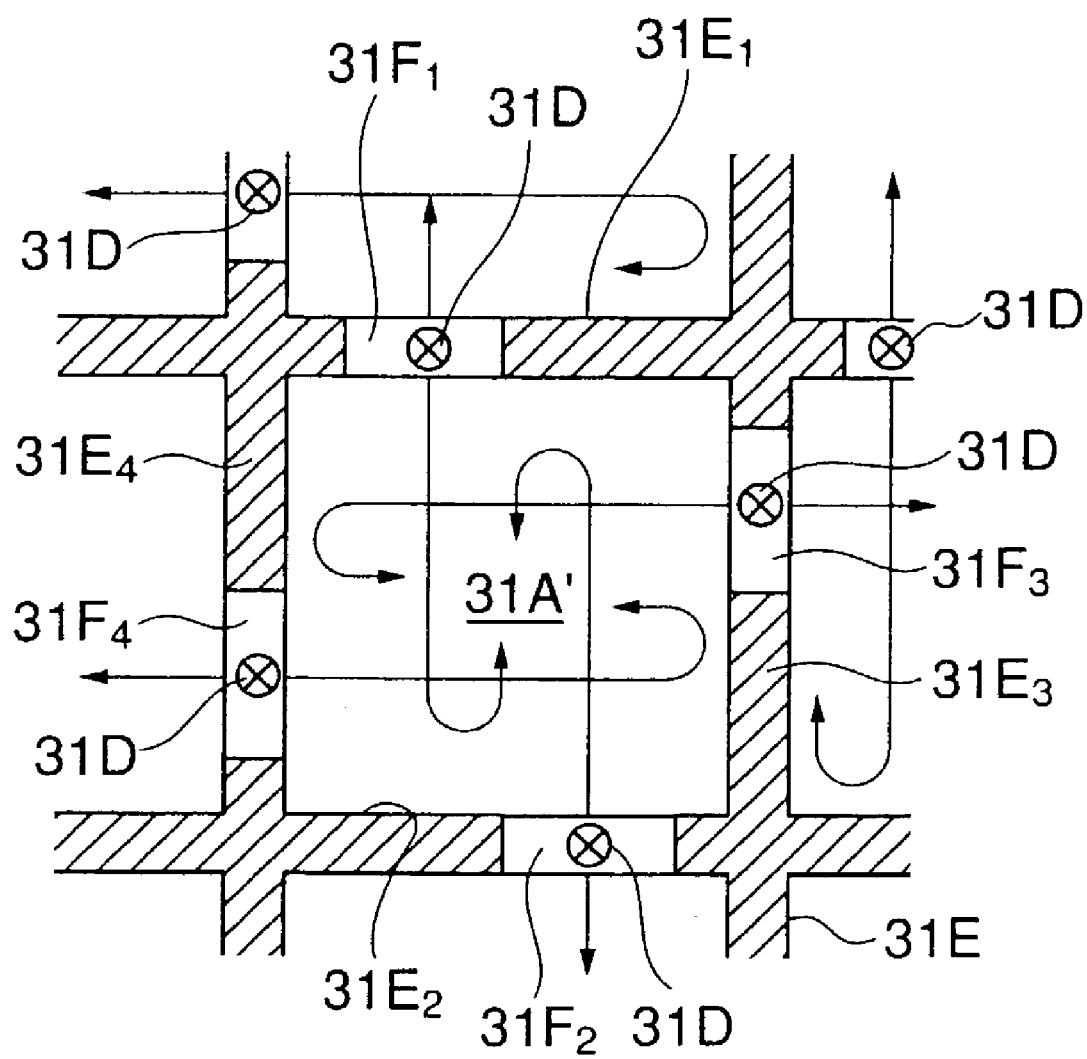
FIG. 9 is a diagram explaining functions of the disk-like conductive body in FIG. 5.

As a result, as shown in FIG. 9, a flow of a process gas curved laterally by the depression $31F_1$ hits a portion $31E_2$ of the lattice-shaped structure 31E in which the depression $31F_2$ is not formed, thereby curving.

Similarly, a flow of a process gas curved laterally by the depression $31F_2$ hits a portion $31E_1$ of the lattice-shaped structure 31E in which the depression $31F_1$ is not formed, thereby curving. A flow of a process gas curved laterally by the depression $31F_3$ hits a portion $31E_4$ of the lattice-shaped structure 31E in which the depression $31F_4$ is not formed, thereby curving. A flow of a process gas curved laterally by the depression $31F_4$ hits a portion $31E_3$ of the lattice-shaped structure 31E in which the depression $31F_3$ is not formed, thereby curving.

As a result of complicated curved flows of the process gas shown in FIG. 9, the flows of the process gas diffuse uniformly and are supplied to the space 11C.

The lattice-shaped process gas passage 31B and the process gas nozzle apertures 31D are provided to cover a slightly larger range than the substrate 12 represented by a broken line in FIG. 5. There is provided such a process gas supply mechanism 31 between the shower plate 14 and the substrate 12, thereby exciting plasma for the process gas. The plasma-excited process gas makes it possible to perform a uniform process.

In a case that the process gas supply mechanism 31 is formed of a conductive material such as metal, an iterated pitch of the lattice-shaped process gas apertures is set shorter than a wavelength of the foregoing microwave, whereby the process gas supply mechanism 31 forms a surface of short circuit of the microwave. In this case, microwave excitation of plasma occurs only in the space 11B and a process gas is activated in the space 11C including a surface of the substrate 12 by plasma diffusing from the excited space 11B.

The microwave plasma processing apparatus 10 according to this embodiment of the present invention uses the process gas supply mechanism 31 to control the uniform supply of a process gas, thereby eliminating an excessive amount of dissociation of the process gas on the surface of the substrate 12. Even if there is formed a structure of a large aspect ratio on the surface of the substrate 12, it is possible to process a desirable substrate as far as an inner portion of such an aspect structure. Thus, the microwave plasma processing apparatus 10 is useful for fabricating a plurality of generations of semiconductor apparatuses differing in designing rules.

In the plasma processing apparatus 10 according to this embodiment of the present invention, the disk-like conductive members $31_1$ and $31_2$ may be formed of an Al alloy containing Mg or a stainless steel added with Al. When the Al alloy containing Mg is used, it is preferable to form membrane of fluoride on surfaces of the members. On the other hand, when the disk-like conductive members $31_1$ and $31_2$ are formed of the stainless steel added with Al, it is desirable to form insulating membrane of alumina on the surfaces of the members. In the plasma processing apparatus 10 according to the present invention, incident energy is small because of a low electron temperature in the excited plasma, thereby avoiding the problem that metal contamination occurs to the substrate 12 by sputtering of the process gas supply mechanism 31. It should be noted that the process gas supply mechanism 31 may be formed of a ceramic such as alumina.

Also, in this embodiment of the present invention, it is possible that either of the disk-like conductive members $31_1$ or $31_2$ is formed of a conductive material and the other is formed of an insulator.

SECOND EMBODIMENT

Figure 10:
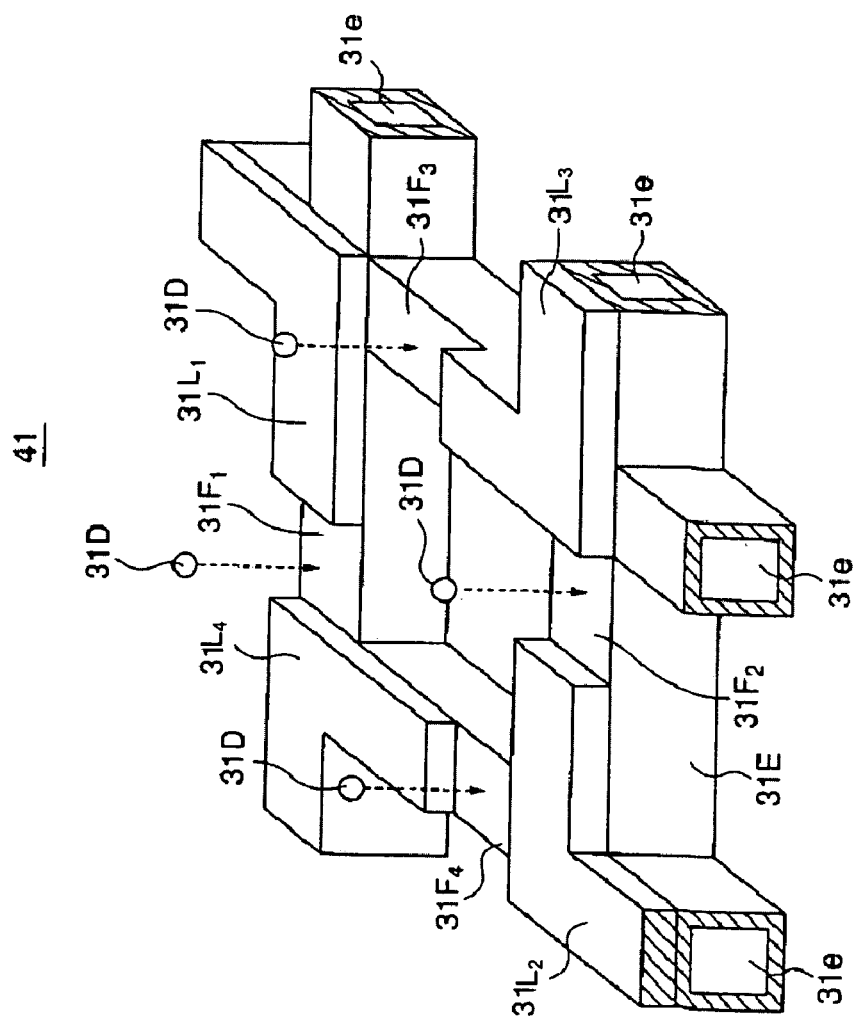
FIG. 10 is a diagram showing a structure of a process gas supply mechanism according to a second embodiment of the present invention.

FIG. 10 shows a structure of a process gas supply mechanism 41 according to a second embodiment of the present invention, wherein those parts explained previously are designated by the same reference numerals and the description thereof will be omitted.

Referring to FIG. 10, in this embodiment, there is formed a coolant passage 31e in the lattice-shaped structure 31E of the disk-like conductive member $31_2$, thereby suppressing an excessive rise of temperature in the process gas supply mechanism 41.

In FIG. 10, there are additionally formed L-shaped spacers $31L_1$ through $31L_4$ on the lattice-shaped structure 31E, wherein the depressions $31F_1$ through $31F_4$ are defined by the spacers $31L_1$ through $31L_4$.

The structure of FIG. 10 is easy to construct. As a result, it is possible to decrease manufacturing cost of the plasma processing apparatus.

THIRD EMBODIMENT

Figure 11:
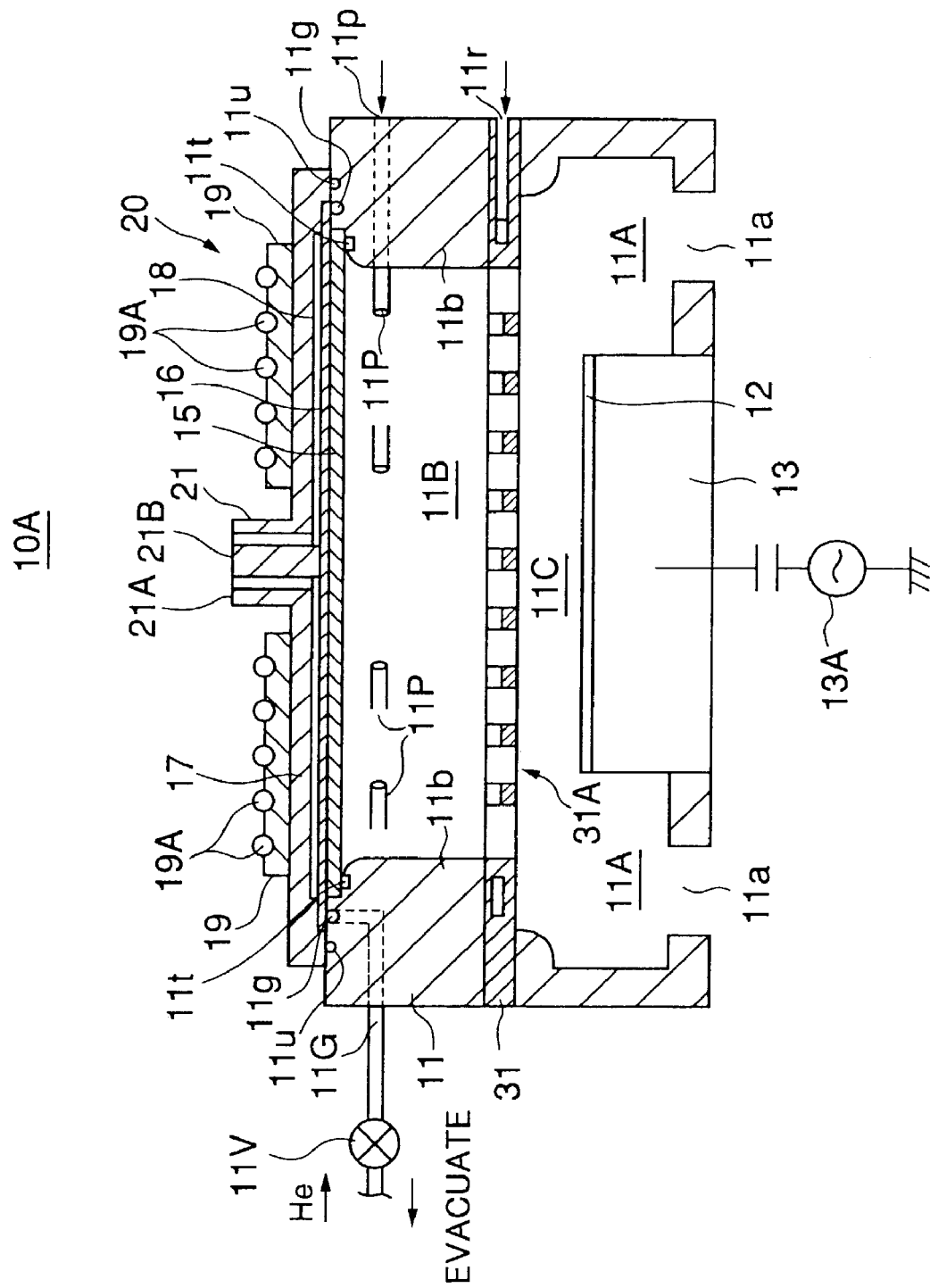
FIG. 11 is a diagram showing a structure of a plasma processing apparatus according to a third embodiment of the present invention.

FIG. 11 shows a structure of a plasma processing apparatus 10A according to a third embodiment of the present invention, wherein those parts explained previously are designated by the same reference numerals and the description thereof will be omitted.

Referring to FIG. 11, in the plasma processing apparatus 10A, the foregoing shower plate 14 is removed and there are instead formed a plurality of plasma gas supply pipes 11P in the process vessel 11 in communication with a gas passage 11p, preferably with symmetry. In the plasma processing apparatus 10A according to this embodiment of the present invention, it is possible to simplify the structure thereof and decrease the manufacturing cost thereof.

Also in such a plasma processing apparatus 10A, it is possible to supply a process gas to the space 11C on the substrate 12 uniformly and with reliability by using the process gas supply mechanism 31 or 41 in FIG. 4. Especially, by using the process gas supply mechanism 41, it becomes possible to avoid an excessive rise in temperature in the process gas supply mechanism.

FOURTH EMBODIMENT

Figure 12:
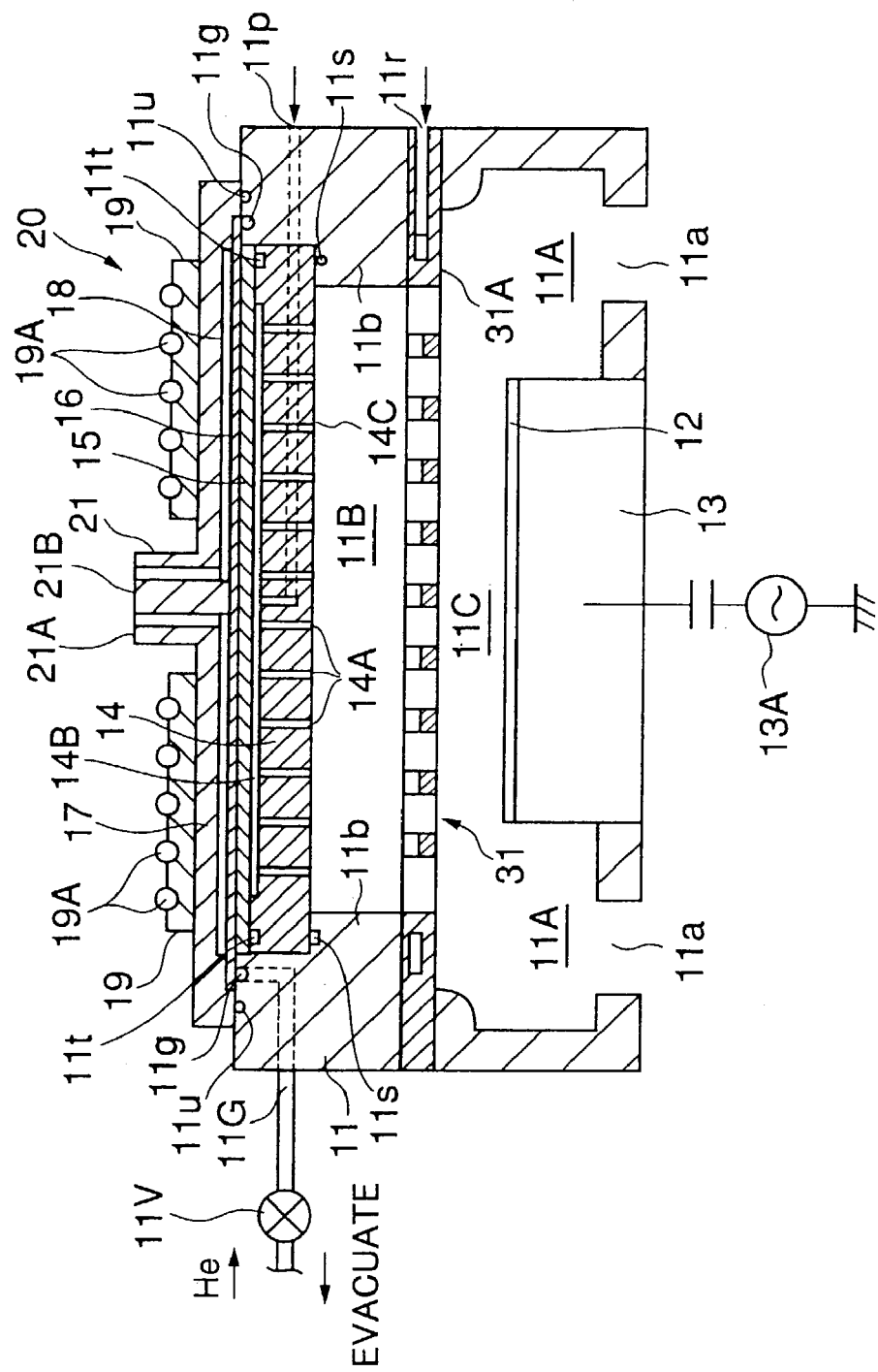
FIG. 12 is a diagram showing a structure of a plasma processing apparatus according to a fourth embodiment of the present invention.

FIG. 12 shows a plasma processing apparatus 10B according to a fourth embodiment of the present invention, wherein those parts explained previously are designated by the same reference numerals and the description thereof will be omitted.

Referring to FIG. 12, in the plasma processing apparatus 10B according to this embodiment of the present invention, there is formed a taper part at a connecting part between the coaxial waveguide 21 and the radial line slot antenna 20 in the plasma processing apparatus shown in FIGS. 3A and 3B, thereby decreasing rapid change of impedance in the connecting part and the reflection of microwave thereof. For these purposes, there is formed a taper part, similar to taper part 21b shown in FIG. 14, at an edge of a central conductive body 21B in the coaxial waveguide 21 and a taper part, similar to taper part 21a shown in FIG. 14, at a connecting part between a coaxial waveguide 21A and an antenna body 17.

Also in such a plasma processing apparatus 10B, it is possible to supply a process gas to the space 11C on the substrate 12 uniformly and with reliability by using the process gas supply mechanism 31 or 41 in FIG. 4. Especially, it becomes possible to avoid an excessive rise in temperature in the process gas supply mechanism by using the process gas supply mechanism 41.

FIFTH EMBODIMENT

Figure 13:
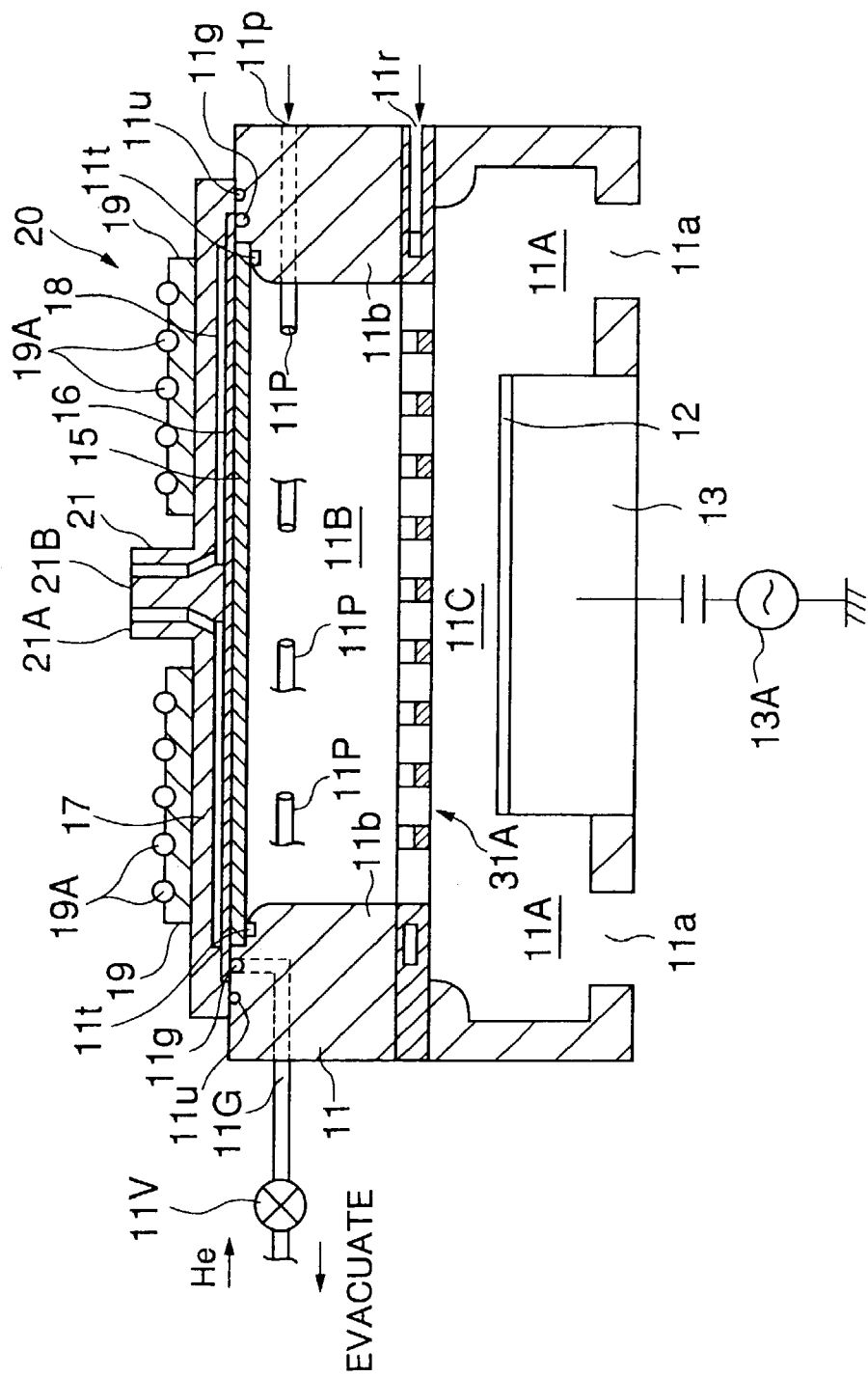
FIG. 13 is a diagram showing a structure of a plasma processing apparatus according to a fifth embodiment of the present invention.

FIG. 13 shows a plasma processing apparatus 10C according to a fifth embodiment of the present invention, wherein those parts explained previously are designated by the same reference numerals and the description thereof will be omitted.

Referring to FIG. 13, in the plasma processing apparatus 10C, the foregoing shower plate 14 is removed from the plasma processing apparatus 10B in FIG. 12 and there are formed a plurality of plasma gas supply pipes 11P in the process vessel 11 in communication with the gas passage 11p, preferably with symmetry. In the plasma processing apparatus 10A according to this embodiment of the present invention, there is formed a taper part at a connecting part between the coaxial waveguide 21 and the radial line slot antenna 20, thereby suppressing reflection of microwave caused by rapid change of impedance. Additionally, it becomes possible to simplify the structure thereof by providing the plasma gas supply pipes 11p instead of the shower plate 14 and decrease considerably manufacturing cost of the plasma processing apparatus.

Also in such a plasma processing apparatus 10C, it becomes possible to supply a process gas to the space 11C on the substrate 12 uniformly and with reliability by using the process gas supply mechanism 31 or 41 in FIG. 4. Especially, it becomes possible to avoid an excessive rise in temperature in the process gas supply mechanism by using the process gas supply mechanism 41.

SIXTH EMBODIMENT

Figure 14:
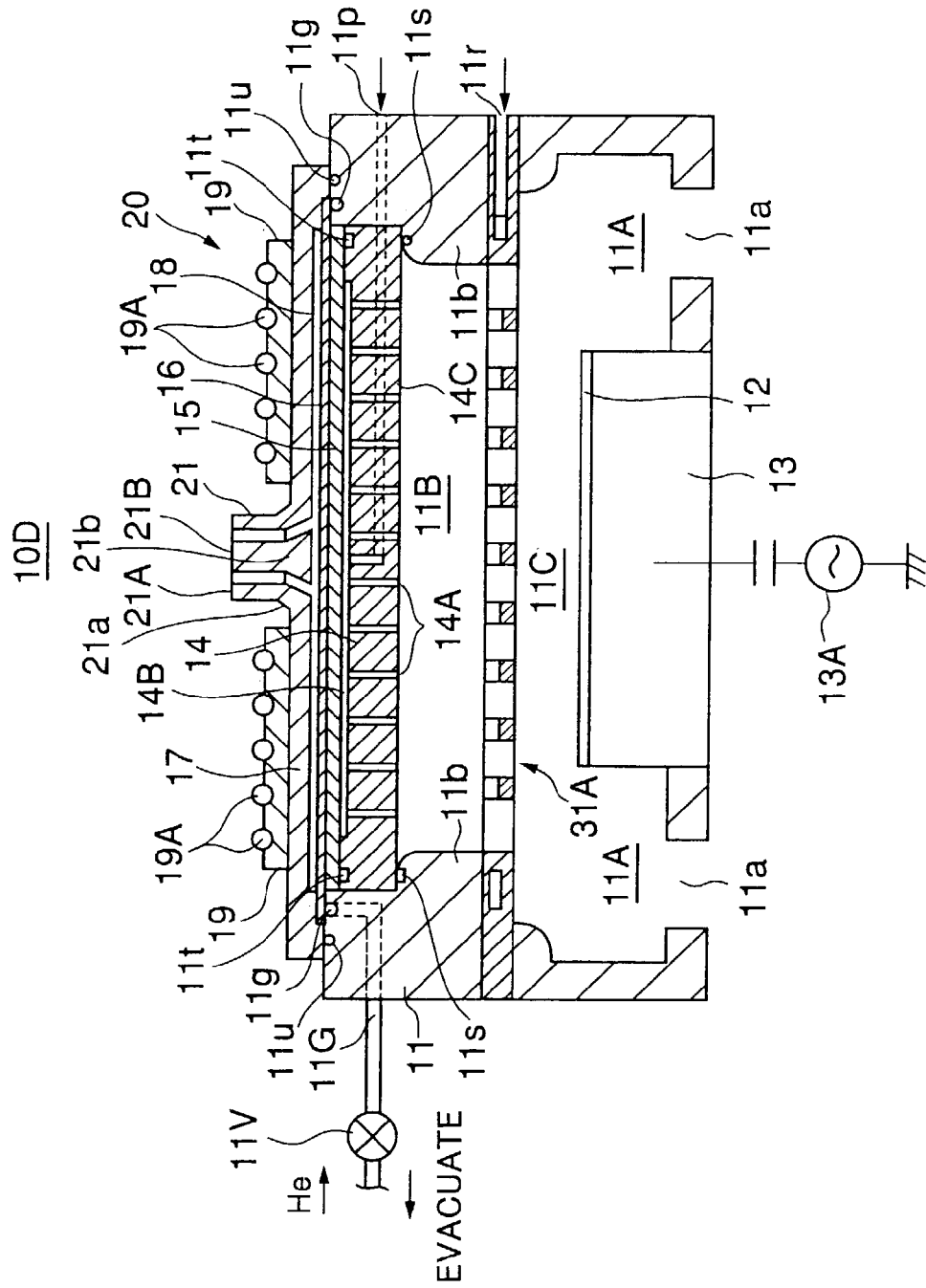
FIG. 14 is a diagram showing a structure of a plasma processing apparatus according to a sixth embodiment of the present invention.

FIG. 14 shows a structure of a plasma processing apparatus 10D according to a fourth embodiment of the present invention, wherein those parts explained previously are designated by the same reference numerals and the description thereof will be omitted.

Referring to FIG. 14, in the plasma processing apparatus 10D according to this embodiment of the present invention, there is provided the retardation plate 18 between the edge 21b of the central conductive body 21B of the coaxial waveguide 21 and the slot plate 16, wherein the retardation plate 18 is detached from the slot plate 16. In such a plasma processing apparatus 10D, it is not necessary to screw the edge 21b of the central conductive body 21B on the slot plate 16, whereby a surface of the slot plate 16 becomes definitely flat. As a result, it is possible to contact the radial line slot antenna 20 with the cover plate 15 with high precision and suppress efficiently a rise in temperature of the shower plate 14 and the cover plate 15 by cooling the radial line slot antenna 20.

In such a plasma processing apparatus 10D, it is possible to supply a process gas to the space 11C on the substrate 12 uniformly and with reliability by using the process gas supply mechanism 31 or 41 in FIG. 4. Especially, it becomes possible to avoid an excessive rise in temperature in the process gas supply mechanism by using the process gas supply mechanism 41.

SEVENTH EMBODIMENT

Figure 15:
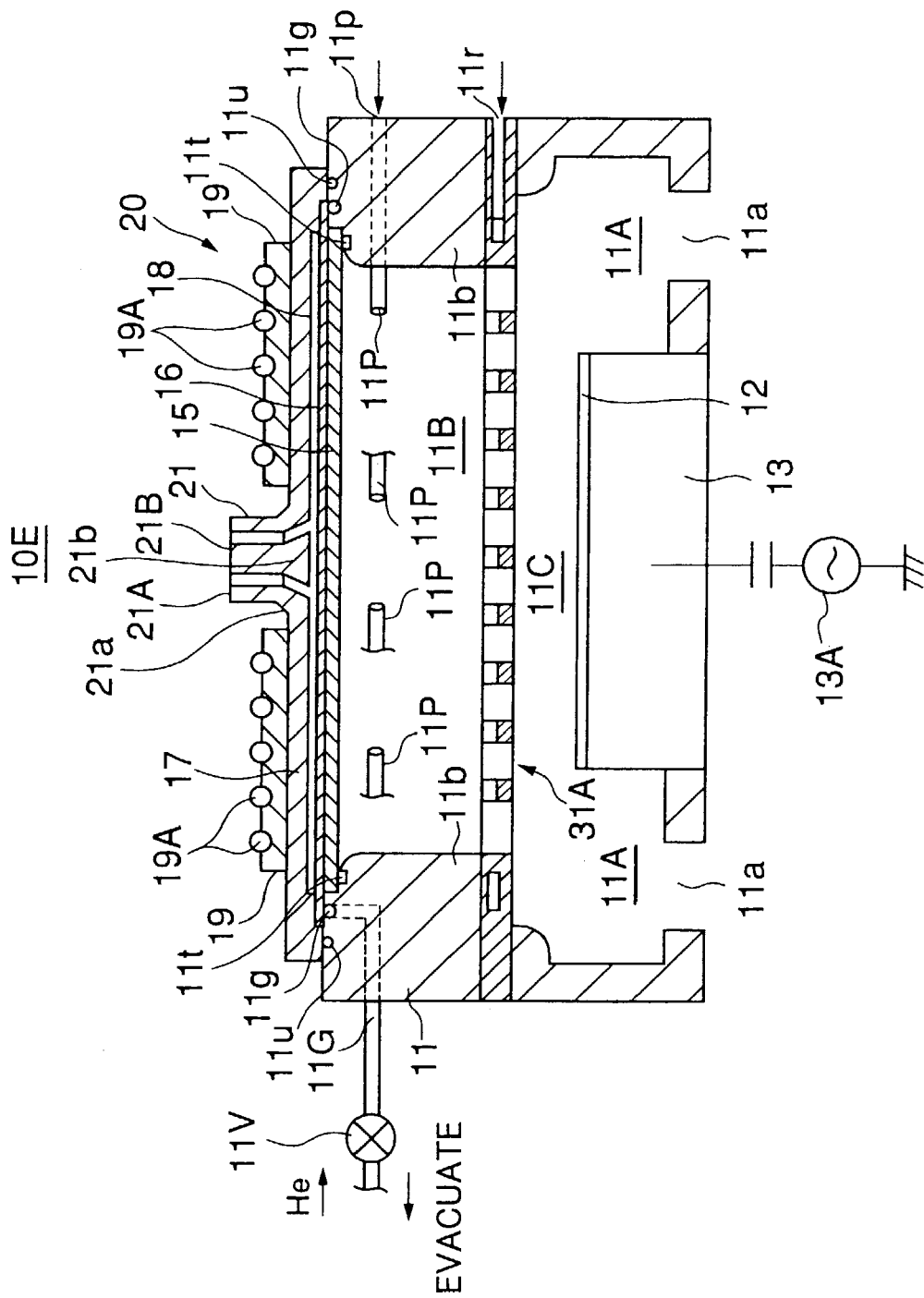
FIG. 15 is a diagram showing a structure of a plasma processing apparatus according to a seventh embodiment of the present invention.

FIG. 15 shows a structure of a plasma processing apparatus 10E according to a seventh embodiment of the present invention, wherein those parts explained previously are designated by the same reference numerals and the description thereof will be omitted.

Referring to FIG. 15, in the plasma processing apparatus 10E, the shower plate 14 is removed from the plasma processing apparatus 10D in FIG. 14, and there are formed a plurality of plasma gas supply pipes 11P in the process vessel 11 in communication with the gas passage 11p, preferably with symmetry. As a result, in the plasma processing apparatus 10E, it is possible to make the structure thereof simpler than that of the plasma processing apparatus 10D and decrease considerably manufacturing cost of the plasma processing apparatus.

In such a plasma processing apparatus 10E, it is possible to supply a process gas to the space 11C on the substrate 12 uniformly and with reliability by using the process gas supply mechanism 31 or 41 in FIG. 4. Especially, it becomes possible to avoid an excessive rise in temperature in the process gas supply mechanism by using the process gas supply mechanism 41.

EIGHTH EMBODIMENT

FIG. 16 shows a structure of a plasma processing apparatus 10F according to an eighth embodiment of the present invention, wherein those parts explained previously are designated by the same reference numerals and the description thereof will be omitted.

Referring to FIG. 16, in the plasma processing apparatus 10F, the cover plate 15 is removed from the plasma processing apparatus 10E and the slot plate 16 of the radial line slot antenna 20 is exposed to the interior of the processing vessel 11.

In such a plasma processing apparatus 10F, although the slot plate 16 is mounted on the processing vessel 11 via the seal ring 11t, it is not necessary to provide a seal ring to seal the edge 21b of the central conductive body 21B toward an air pressure because the edge 21b of the central conductive body 21B is formed behind the retardation plate 18. According to this embodiment of the present invention, it becomes possible to excite efficiently microwave in the processing vessel 11 without loss of the microwave because the slot plate 16 of the radial line slot antenna 20 is exposed to the interior of the processing vessel 11.

Also in such a plasma processing apparatus 10F, it is possible to supply a process gas to the space 11C on the substrate 12 uniformly and with reliability by using the process gas supply mechanism 31 or 41 in FIG. 4. Especially, it becomes possible to avoid an excessive rise in temperature in the process gas supply mechanism by using the process gas supply mechanism 41.

NINTH EMBODIMENT

Figure 17A:
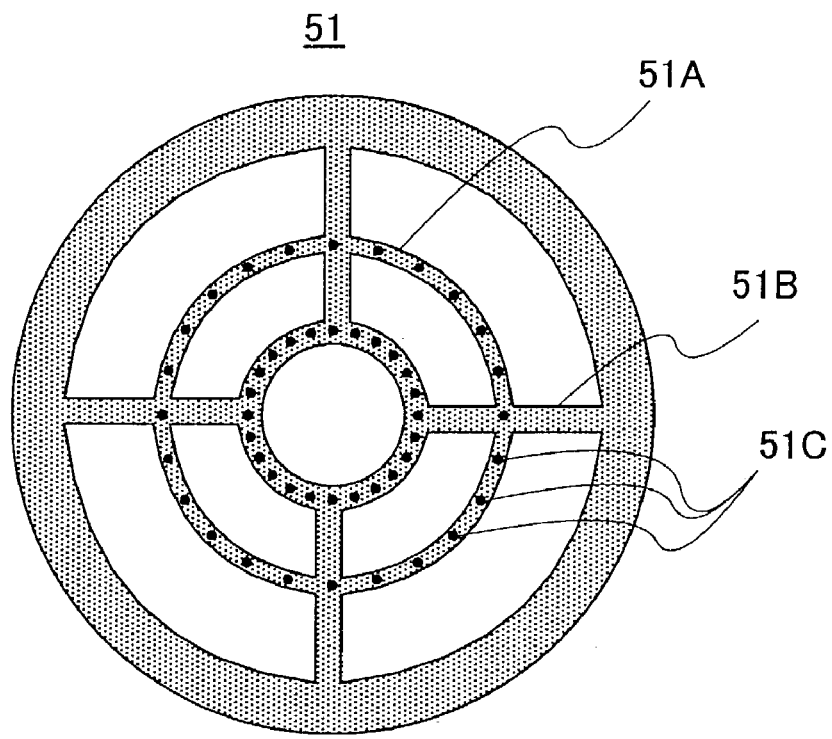
FIGS. 17A and 17B are diagrams showing portions of a plasma processing apparatus according to a ninth embodiment of the present invention.
Figure 17B:
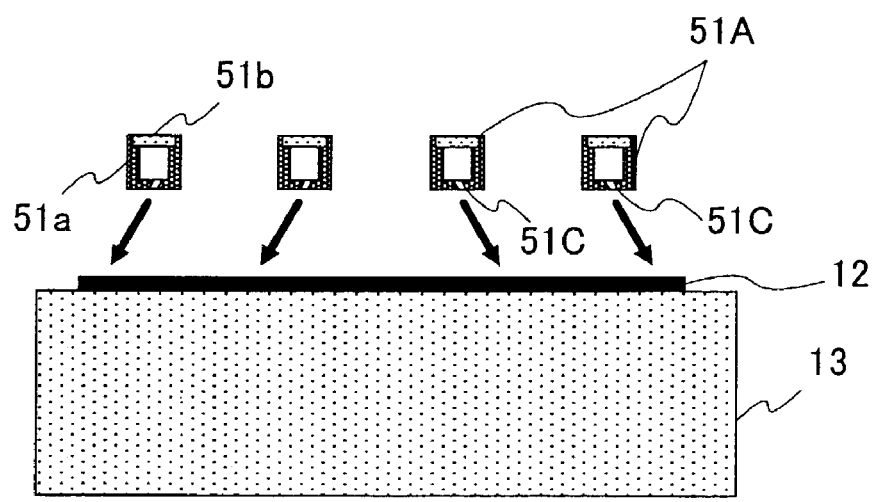

FIGS. 17A and 17B are a bottom view and a sectional view showing a structure of the process gas supply mechanism 51 according to a ninth embodiment of the present invention, respectively, wherein those parts explained previously are designated by the same reference numerals and the description thereof will be omitted.

Referring to FIG. 17A, according to this embodiment of the present invention, the process gas supply mechanism 31 includes a spoke part 51B that is provided as a process gas passage and is extended in the radial direction and a concentric ring-shaped part 51A that is formed as a process gas passage and is held by the spoke part 51B, wherein there are formed a large number of process gas supply nozzle apertures 51C on a bottom surface of the concentric ring-shaped part 51A.

Referring to FIG. 17B, according to this embodiment of the present invention, the process gas supply nozzle apertures 51C are formed with a slant and releases a process gas in a slanting direction with respect to the substrate 12.

When the process gas is released in the slanting direction from the process gas supply nozzle apertures 51C to the substrate 12, the released process gas bounces off the substrate 12, thereby avoiding the problem that there is formed deposition of reaction byproducts on a surface of the shower plate 103.

As shown in FIG. 17B, the concentric ring-shaped part 51A has a structure such that a section in which there are formed grooves corresponding to process gas supply passages covers a surface of a U-shaped part 51a with a lid 51b. As a result, the process gas nozzle apertures 51C can be formed by a slanting processing of the U-shaped part 51a.

TENTH EMBODIMENT

A description will be given of a tenth embodiment of the present invention.

According to this embodiment of the present invention, in order to suppress the deposition of reaction byproducts on the surface of the shower plate 103, the foregoing coolant block 19 serves as a temperature control apparatus under a substrate processing apparatus 10 in FIG. 3A, a substrate processing apparatus 10A in FIG. 11, a substrate processing apparatus 10B in FIG. 12, a substrate processing apparatus 10C in FIG. 13, a substrate processing apparatus 10D in FIG. 14 or a substrate processing apparatus 10E in FIG. 15, wherein the coolant block 19 controls a surface temperature of the shower plate 13 or the cover plate 15 with respect to the side faced on the substrate 12 around 150° C. via the radial line slot antenna 20. At the time, a process gas supply mechanism shown in FIGS. 17A and 17B may be used.

As a result of the temperature control of the shower plate 13 or the cover plate 15 around 150° C., even if CVD coating process or plasma etching process is performed in the processing space 11C, it becomes possible to suppress deposition on the surface of the shower plate 13 or the cover plate 15.

On the other hand, when the foregoing temperature is substantially above 150° C., it is likely that process gas supplied from the process gas supply mechanism 31, 41 or 51 is dissolved. Thus, it is preferable to control the temperature of the shower plate 13 or the cover plate 15 less than 150° C.

By letting a medium such as galden in a coolant passage 19A of the coolant block 19, it is possible to control the temperature.

Further, the present invention is not limited to the specific embodiments noted above but various variations and modifications may be made within the scope of the invention set forth in claims.

INDUSTRIAL APPLICABILITY

According to the present invention, in a microwave plasma processing apparatus, it is possible to supply a process gas to an interior of a processing vessel uniformly and perform a uniform plasma process.

The invention claimed is:

1. A plasma processing apparatus, comprising:
    a processing vessel defined by an outer wall and having a stage for holding a substrate to be processed;
    an evacuation system coupled to said processing vessel;
    a plasma gas supply part for supplying plasma gas to an interior of said processing vessel;
    a microwave antenna provided on said processing vessel; and
    a process gas supply part provided between said substrate to be processed on said stage and said plasma gas supply part so as to face said substrate to be processed on said stage, wherein said process gas supply part comprises:
a first component comprising a plurality of first apertures configured to provide flow communication for passing plasma formed in the interior of said processing vessel, a process gas passage capable of connecting to a process gas source, and a plurality of second apertures in flow communication with said process gas passage; and
a second component comprising a plurality of third apertures corresponding to and being in substantially axial alignment with said first apertures of said first component and a plurality of diffusion surfaces upon recessed areas of said second component positioned opposite to said second apertures in said first component.

2. The microwave plasma processing apparatus of claim 1, wherein the recessed areas are positioned around each of the plurality of third apertures such that process gas incident on the diffusion surfaces forms a flow and enters one or more of the plurality of third apertures along a path that is offset from a center of the one or more of the plurality of third apertures.

3. The microwave plasma processing apparatus of claim 2, wherein the second component is configured to cause curvature of the flow within the one or more of the plurality of third apertures.

4. The microwave plasma processing apparatus of claim 2, wherein the plurality of third apertures are substantially rectangular shaped and each of said recessed areas is located adjacent to a corner of one or more of the plurality of third apertures.

5. The microwave plasma processing apparatus of claim 1, wherein said second component is formed so as to direct said process gas released from said second apertures through the plasma supplied to said third apertures.

6. The microwave plasma processing apparatus of claim 1, wherein at least one spacer member is provided between said first component and said second component and spaced apart from said diffusion surfaces.

7. The microwave plasma processing apparatus of claim 6, wherein said spacer members are formed integrally with said second component.

8. The microwave plasma processing apparatus of claim 1, wherein said process gas supply part is formed of a conductive material.

9. The microwave plasma processing apparatus of claim 1, wherein said process gas supply part is grounded.

10. The microwave plasma processing apparatus of claim 1, wherein said process gas supply part includes stainless steel and aluminum.

11. The microwave plasma processing apparatus of claim 1, wherein said plasma gas supply part comprises a plasma gas inlet pipe capable of connecting to a plasma gas source, and said microwave antenna is coupled to a microwave transmission window formed on a part of said outer wall of said processing vessel for providing microwave energy to said processing vessel.

12. The microwave plasma processing apparatus of claim 1, wherein said plasma gas supply part comprises a plasma gas inlet pipe capable of connecting to a plasma gas source, and said microwave antenna is coupled to an aperture formed on a part of said outer wall of said processing vessel for providing microwave energy to said processing vessel.

13. The microwave plasma processing apparatus of claim 1, wherein said plasma gas supply part comprises a plasma gas passage coupled to a microwave transmission window formed on a part of said outer wall of said processing vessel for providing microwave energy to said processing vessel, said plasma gas passage being capable of connecting to a plasma gas source, and a shower plate having a plurality of gas inlets communicating with said plasma gas passage.

* * * * *